United States Patent [19]
Udo

[11] Patent Number: 6,020,779
[45] Date of Patent: Feb. 1, 2000

[54] ELECTRICAL SWITCHING DEVICE WITH CONTROL SIGNAL INPUT

[75] Inventor: John Udo, Poing, Germany

[73] Assignee: STMicroelectronics GmbH, Grasbrunn, Germany

[21] Appl. No.: 08/770,790

[22] Filed: Dec. 20, 1996

[30] Foreign Application Priority Data

Dec. 20, 1995 [DE] Germany ........................... 195 47 768

[51] Int. Cl.⁷ ................................................ H03K 17/16
[52] U.S. Cl. ............................ 327/537; 327/108; 327/333; 327/387; 327/389; 327/327
[58] Field of Search ..................................... 327/427, 333, 327/365, 379, 384, 391, 387, 388, 537, 536, 389, 327, 328

[56] References Cited

U.S. PATENT DOCUMENTS

| | | | |
|---|---|---|---|
| 4,001,606 | 1/1977 | Dingwall | 327/383 |
| 4,532,436 | 7/1985 | Bismarck | 327/208 |
| 4,795,917 | 1/1989 | Scott et al. | 326/87 |
| 4,996,443 | 2/1991 | Tateno | 327/333 |
| 5,552,746 | 9/1996 | Danstrom | 327/427 |
| 5,587,676 | 12/1996 | Chowdhury | 327/333 |

FOREIGN PATENT DOCUMENTS

| | | | |
|---|---|---|---|
| 05083104 | 4/1993 | Japan | H03K 17/687 |
| 405095273 | 4/1993 | Japan | 326/27 |
| 5-83104 | 4/1993 | Japan | . |
| 05308274 | 11/1993 | Japan | H03K 19/0185 |

*Primary Examiner*—Dinh T. Le
*Attorney, Agent, or Firm*—Theodore E. Galanthay; David V. Carlson; Seed and Berry LLP

[57] ABSTRACT

An electrical switching device including a switch having a control terminal, a control circuit coupled between a first voltage source terminal and a second voltage source terminal and a control signal input coupled to receive a binary switching control signal.

16 Claims, 4 Drawing Sheets

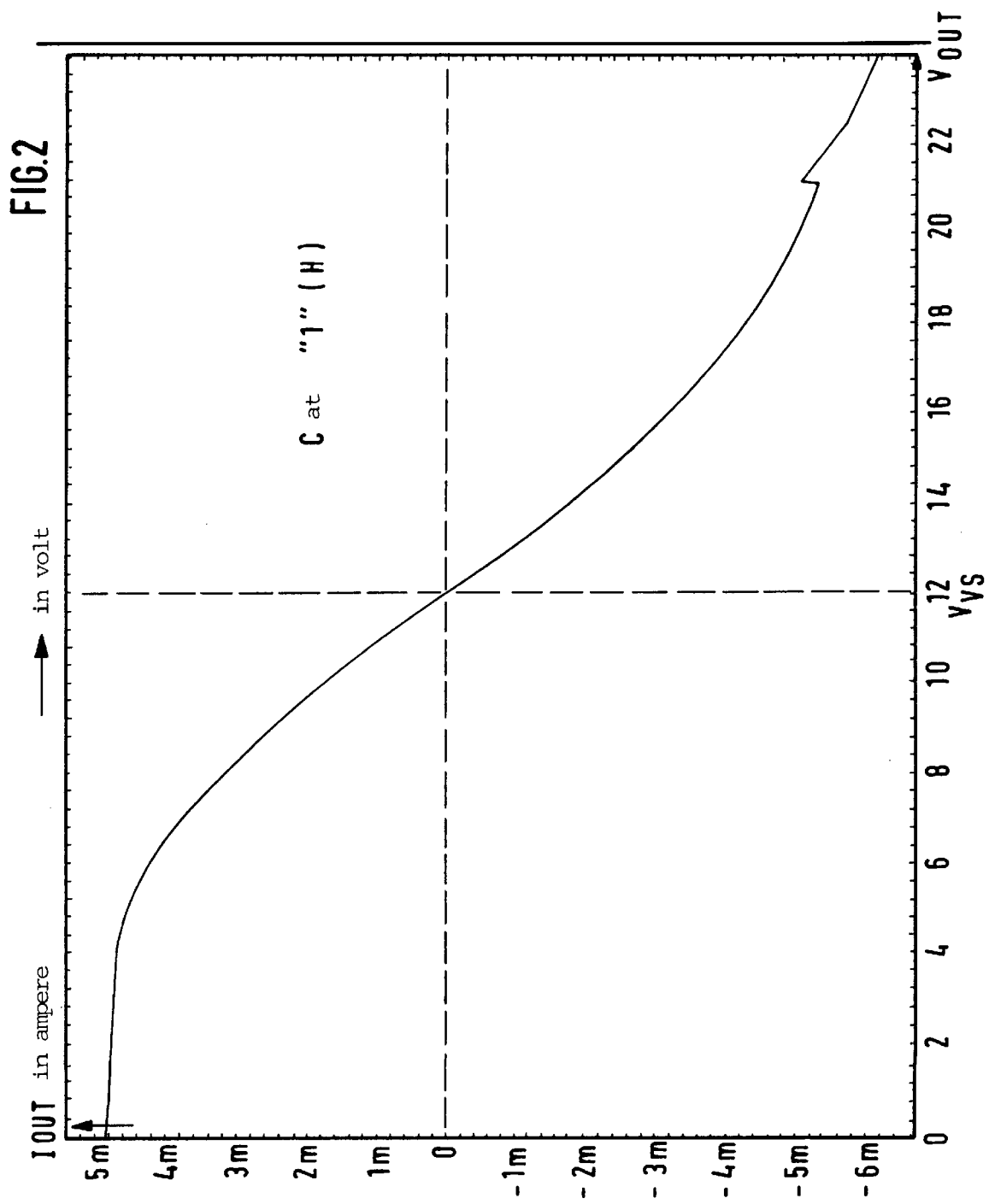

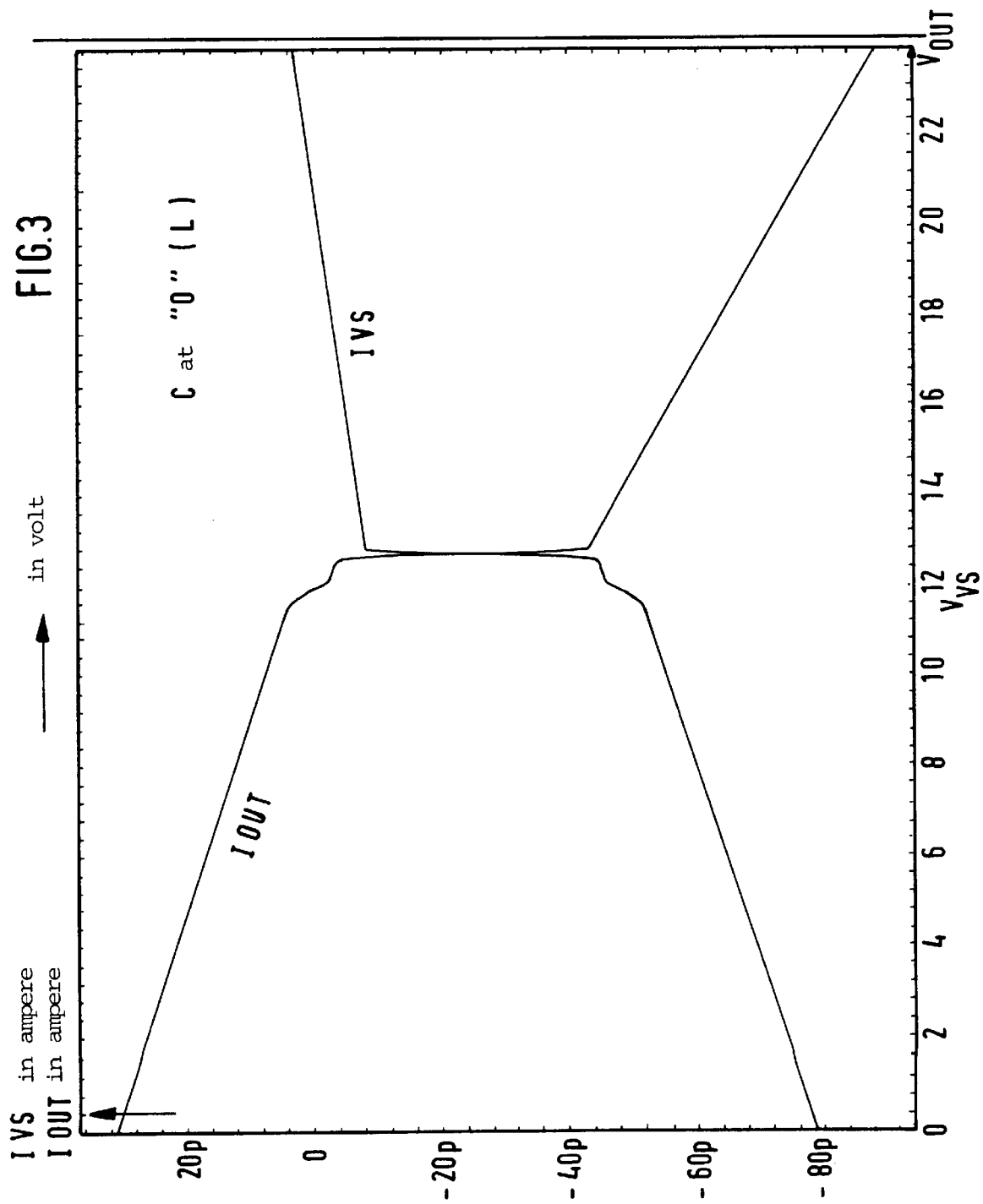

ELECTRICAL SWITCHING DEVICE WITH CONTROL SIGNAL INPUT

TECHNICAL FIELD

The invention relates to an electrical switching device comprising a switch means having a switching control terminal, with the switching operation of said switch means being controlled by a control circuit.

BACKGROUND OF THE INVENTION

There are applications in which an electrical load is switched by a switch in the form of an NMOS transistor, i.e., an N-channel MOS transistor, with said switch being located on the side of the high potential, i.e., on the side of the high potential of the load. With an NMOS disposed on the high potential side, the source thereof is usually disposed on the supply voltage source on the high potential side. In order to be able to switch the NMOS transistor to the conducting state, a control voltage must be supplied to the gate thereof which must be higher than the voltage present at the source thereof by at least the switching-on threshold value leading to conduction of this transistor, i.e., the gate of this NMOS transistor must be fed with a control voltage that is higher than the supply voltage on the high potential side. To this end, a voltage increasing circuit is required, for example in the form of a bootstrap circuit, an inductive dc-dc voltage converter or a charge pumping circuit. For inexpensive integrated circuits, a charge pumping circuit is preferred most since it does not require external components. When the integrated circuit has to make do with low supply voltages, care has to be taken that minimum internal voltage drops are obtained.

Conventional charge pumping circuits comprise a T-type circuit having two series-connected diodes in the series branch and a pumping capacitor in the shunt branch located therebetween. One of the diodes, on the side remote from the pumping capacitor, is connected to a supply voltage source and permits the charging voltage to pass to the capacitor without permitting discharge of the latter via the supply voltage source. The second diode serves for decoupling the charging or pumping capacitor from a load connected to the end of the second diode remote from the pumping capacitor. With the conventional charge pumping circuit it is thus not possible to avoid a voltage drop corresponding to a double diode voltage drop.

It would be possible now to use instead of diodes switches such as DMOS transistors. However, such switches in turn would have to be driven by means of an additional charge pumping circuit. Switching of such switching transistors for effecting rectification, which in the case of the conventional charge pumping circuit is effected by diodes, results in an increase in EMR (electromagnetic interference radiation) in the range of the basic switching frequency.

Such problems are overcome by an electrical switch device known from JP 5-831 04A, comprising a switch means having a switching control terminal; a control circuit which is connected between a first voltage source terminal and a second voltage source terminal and having a control signal input adapted to have a binary switching control signal applied thereto and having a switching signal output acting on the switching control terminal of the switch means and which contains two control circuit branches connected in parallel to each other, each control circuit branch having a series connection including a first switch, a second switch serving as switchable load impedance for the first switch, and a circuit node located between the first switch and the second switch, with the switching signal output being connected to one of the two circuit nodes, the second switches each having a load impedance switching control terminal and being cross-coupled in that the load impedance switching control terminals thereof are connected to the circuit node of the respective other control circuit branch, the first switches being switchable to the conducting state and to the blocking state in opposite manner by means of the switching control signal such that, when one of the two first switches is switched to the conducting state, the respective other first switch is switched to the blocking state and vice versa, and the second switches, due to their cross-coupling to each other and due to their series connection with the first switches, being switchable on the one hand in opposition to each other to the conducting state and to the blocking state such that, when one of the two second switches is switched to the conducting state, the respective other one of the second switches is switched to the blocking state, and vice versa, and being switchable on the other hand in opposition to the first switches to the blocking state and to the conducting state such that in each control circuit branch, when the first switch thereof is switched to the conducting state, the second switch thereof is switched to the blocking state, and vice versa.

This switch means of the known switching device causes virtually no voltage drop in the conducting state since a conducting MOS transistor, which preferably constitutes the switch means, has only a very low impedance. Due to the control of the switch means by a control circuit of the type mentioned above, no higher voltage is required for switching the switch means to the conducting state than the voltage switched by the switch means.

When replacing passive circuit components, such as diodes, by active circuit components, such as transistor switches, the result is in general an additional power consumption. This is not so in the case of the afore-mentioned switching device whose control circuit is composed such that it effects switching of the switch means in power-free manner. For, in each of the two control circuit branches there is always one switch switched to the non-conducting state.

Preferably both the switch means and the switches of the control circuit are constituted by MOS transistors. It may happen then that undesirably high voltages, which impair the MOS transistors, occur at the circuit nodes, i.e., also at the gate of the MOS transistor constituting the switch means.

SUMMARY OF THE INVENTION

In order to protect the MOS transistor constituting the switch means and the MOS transistors constituting the second switches which are located on the high potential side from harmful high voltages, the invention provides in each of the two control circuit branches of the control circuit, between the MOS transistor constituting the first switch and the MOS transistor constituting the second switch, a protective transistor preferably in the form of an additional MOS transistor which is permanently maintained in the conducting state by means of a bias voltage source connected between the high potential side of the voltage source and the gate of the protective transistor. The voltages occurring at the circuit nodes of the two control circuit branches and thus at the gate of the MOS transistor constituting the switch means and at the MOS transistors constituting the second switches, thus, can be at most as large as the difference between the voltage value of the bias voltage source and the switching-on threshold value of the gate-source voltage of the respective protective transistor. By suitably dimensioning the bias voltage source measures can thus be taken for making sure that only manageable voltage values can occur on all circuit components located on the high potential side of the protective transistors.

When the switching device according to the invention for connecting through a pumping voltage is connected through to a capacitive load, for example to the gate of an NMOS switching transistor on the high potential side, it may happen that the pumping voltage drops below the instantaneous value of the voltage across the capacitive load. The MOS transistors used for the second switches have parasitic source substrate diodes (hereinafter referred to as SSD) through which the decreased pumping voltage could reach the gate of the MOS transistor constituting the switch means so that said MOS transistor, due to the higher charging voltage of the capacitive load, could reach an inversely conducting state, which is not desirable. For preventing this, a preferred embodiment has in each control circuit branch, between the pumping voltage source and the second switch, a diode that keeps a pumping voltage that has decreased to values below the load capacitance voltage, away from the gate of the MOS transistor constituting the switch means.

When the pumping voltage on the high potential side drops to such an extent that the diode becomes blocking in the control circuit branch connected to the gate of the MOS transistor constituting the switch means, there is, in the event that the first switch of this control circuit branch is switched to the blocking state, a blocking element both on the high potential side and on the low potential side of the gate of the MOS transistor constituting the switch means, said blocking element being the diode and, respectively, the first switch of this control circuit branch. As a result thereof, an undefined potential arises at the gate of this MOS transistor. In accordance with capacitances, leakage currents and parasitic effects, inverse conduction of the MOS transistor constituting the switch means could arise, although this transistor should be in the blocking state. For preventing this effect, a preferred embodiment of the invention provides that the main path of a safety transistor is connected between the switching control terminal of the switch means and the load terminal, with the control electrode of said safety transistor being connected to the pumping voltage terminal on the high potential side and said safety transistor, in the conducting state, applying the load capacitance voltage to the gate of the MOS transistor constituting the switch means, so that inverse conduction of this MOS transistor is prevented.

Further embodiments and developments of the invention are indicated in the dependent claims.

The switching device according to the invention has many uses. In one possible application, the two diodes of a conventional charge pumping circuit are each replaced by a switching device according to the invention. However, it is also possible to use the switching device according to the invention for controlling a MOS switching transistor located on the high potential side. However, it is possible as well to replace such a high potential side MOS switching transistor by the switching device according to the invention.

BRIEF DESCRIPTION OF THE DRAWINGS

The invention will now be elucidated in more detail by way of embodiments shown in the drawings in which

FIG. 2 shows an impedance characteristic of the switching device according to FIG. 1 when the latter is switched to the conducting state.

FIG. 3 shows impedance characteristics of the switching device according to FIG. 1 when the latter is switched to the non-conducting state.

DETAILED DESCRIPTION OF THE INVENTION

Figure 1:
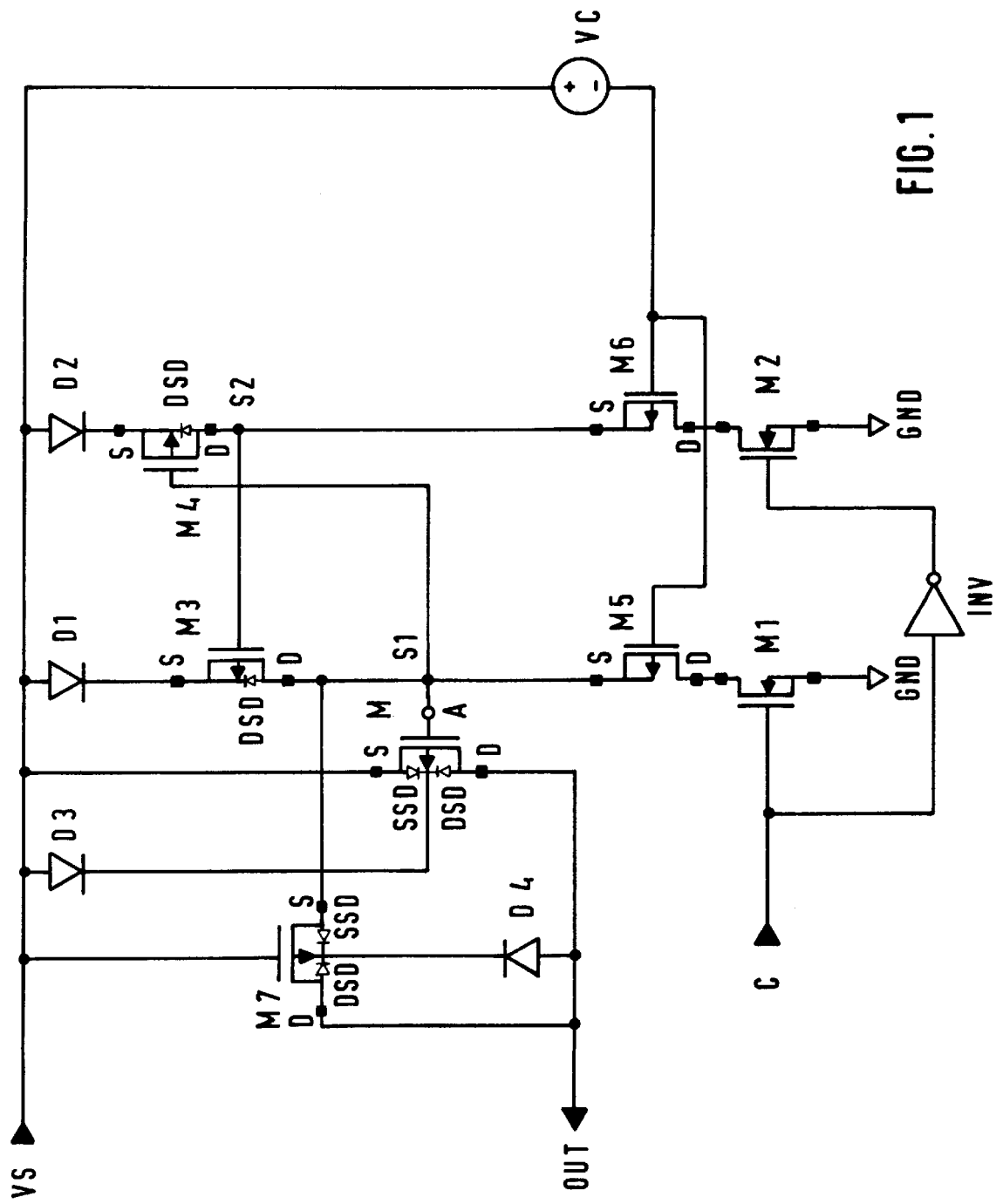
FIG. 1 shows a circuit diagram of a preferred embodiment of a switching device according to the invention.

An embodiment of a switching device as shown in FIG. 1 comprises a supply voltage input VS, an output OUT to which a switchable load may be connected, and a control signal input C. Between VS and OUT there is connected a switch means in the form of a P-channel MOS transistor M, with the source S thereof being connected to VS and the drain D thereof being connected to OUT.

The gate of M is connected to a switching signal output A of a control circuit by means of which M, depending on whether a binary value "1" or H or a binary value "0" or L is present at the control signal input C, is switched to the conducting or to the blocking state. The control circuit is connected between the supply voltage input VS and a ground terminal GND. The control circuit comprises two control circuit branches connected in parallel. Each of said two control circuit branches comprises a series connection having a first switch M1 and M2, respectively, on the low potential or mass side, a second switch M3 and M4, respectively, on the high potential side, serving as a switchable load impedance for the first switch M1 and M2, respectively, a protective transistor M5 and M6, respectively, between said first and second switches, and a diode D1 and D2, respectively, between the second switch and VS. In the embodiment shown, both the two first switches M1 and M2 and the two second switches M3 and M4 are constituted by MOS transistors.

The gate terminals of M1 and M2 are connected to the control signal input C, the gate terminal of M1 being directly connected thereto and the gate terminal M2 via an inverter INV. The gate terminals of the protective transistors M5 and M6 are commonly connected to the supply voltage input VS via a bias voltage source VC. The positive terminal of VC is connected to VS and the negative terminal of VC is connected to the gate terminals of M5 and M6.

Between transistors M3 and M5 of the first control circuit branch there is provided a first circuit node S1. A second circuit node S2 is provided between transistors M4 and M6 of the second control circuit branch.

The MOS transistors serving as second switches M3 and M4 are cross-coupled such that the gate terminal of M3 is connected to circuit node S2 and the gate terminal of M4 is connected to circuit node S1.

Between OUT and S1 there is connected a safety transistor M7 in the form of a MOS transistor. The drain terminal D thereof is connected to OUT, while the source S thereof is connected to S1. The gate terminal of M7 is connected to VS.

With a MOS transistor, the source and the substrate thereof are normally electrically connected to each other, as shown in FIG. 1 for the two switches M3 and M4 as well as for the two protective transistors M5 and M6 in symbolic manner in that the substrate arrows thereof are connected to the source terminal S of the respective transistor. Transistors M and M7 differ from this normal case in that their bulk or substrate terminals and their source terminals are electrically isolated from each other and are provided with separate contacts. This is why the substrate arrows in case of these two transistors M and M7 are represented as a fourth terminal which in case of transistor M is connected to VS via a diode D3 and in case of transistor M7 is connected to OUT via a diode D4.

Diodes D1 and D2 are diffusion diodes, whereas diodes D3 and D4 are Schottky diodes. The anodes of the three diodes D1, D2 and D3 are applied to the supply voltage input VS, while the anode of diode D4 is applied to OUT.

Transistors M1 and M2 are N-channel MOS transistors. The remaining transistors M and M3 to M7 are P-channel MOS transistors.

MOS transistors have parasitic diodes illustrated in FIG. 1 in those transistors in which they are of importance for the function of the switching device shown in FIG. 1 as elucidated hereinafter. These parasitic diodes constitute on the one hand a diode path from the drain terminal to the substrate terminal, herein referred to as drain substrate diode DSD, and on the other hand a diode path from the source terminal to the substrate terminal, herein referred to as source substrate diode SSD. The source region and a substrate contacting region are as a rule electrically connected to each other, usually in that they have a common contacting metallization. The latter short-circuits the parasitic source substrate diode SSD, as shown symbolically for transistors M3 and M4. The drain substrate diode DSD thereof thus constitutes a parasitic connection between drain and source of such a transistor.

If in contrast thereto the source region and the substrate contacting region are electrically isolated from each other, as in case of transistors M and M7, parasitic connections are present on the one hand between drain and substrate and on the other hand between substrate and source, via the parasitic drain substrate diodes DSD and the parasitic source substrate diodes SSD, respectively.

In case of corresponding voltage conditions within the circuit, such parasitic diodes may be conducting, with the result that the conducting and blocking functions proper of MOS transistors are falsified.

The bias voltage source VC has such a voltage value that the protective transistors M5 and M6 are permanently biased to become conducting to provide protection. Across the source-gate paths of these transistors, there is thus applied a source-gate voltage which is at least as high as the threshold voltage necessary for conduction of these transistors. Thus, between VS and the source terminals S of the two transistors M5 and M6 is at the most a voltage equal to the difference between the voltage value of VC and the threshold voltage of transistors M5 and M6. For example, assuming that there is a threshold value of 2 V and a voltage value of the bias voltage source VC of 10 V, a voltage of at the most 8 V occurs between VS and the source terminals of M5 and M6. This holds also in the case where the supply voltage input VS has much higher voltages applied thereto. The protective transistors M5 and M6 protect both the gate of M and the components located on the high potential side of the protective transistors, namely transistors M3 and M4 as well as diodes D1 and D2.

With a practical realization of the circuit shown in FIG. 1, the voltage value of bias voltage source VC thus is to be selected such that, upon deduction of the gate-source threshold value on the source terminals of M5 and M6 which causes conduction of M5 and M6, only a voltage is left that is appropriate for the gate of M and for transistors M3 and M4 as well as diodes D1 and D2.

In the following, the mode of operation of the circuit shown in FIG. 1 will be elucidated. It is assumed in this respect that OUT has a capacitive load connected thereto, for example the gate of a MOS switching transistor on the high potential side which is to be switched to the conducting and blocking states by means of the switching device according to FIG. 1. For subjecting the supply voltage source connected to VS, for example in the form of a charge pumping circuit, to as little loads as possible, switching control is to take place in power-free manner and without a voltage drop as it would be caused for example by diodes. Moreover, the capacitive load connected to OUT should not be discharged by the switching device according to FIG. 1 even if the supply voltage applied to VS drops to the range of the load applied across the capacitive load and thus to OUT, or even to a still lower value.

Switching ON/OFF of switching transistor M takes place via a binary switching control signal supplied to control signal input C. When the switching control signal has a high potential H, having for example the binary value "1" associated therewith, M1 is switched to the conducting state and M2 is switched to the non-conducting state. Due to the fact that the two protective transistors M5 and M6 are always switched to the conducting state, a low potential, which virtually is ground potential, thus reaches the first circuit node S1 and thus the gate of M via switching signal output A. The low potential at S1 has the effect that M4 is conducting, so that a high potential is applied to S2, which virtually is the voltage value present at VS. This causes blocking of M3. A defined low potential is thus ensured at the gate of M, so that M is safely conducting and a charging current can flow from VS via M and OUT to the capacitive load connected to OUT.

The prerequisite therefor is that the potential of VS is higher than the mass potential connected through to S1 via M1 and M5, to such an extent that the gate source voltage of M is above the threshold value for the conduction of M. The diodes D1 and D2 are conducting under this prerequisite.

When a control signal with low potential L or binary value "0" is applied to the control signal input C, M1 is blocking whereas M2 is conducting. A low potential is thus applied to circuit node S2, so that M3 is conducting. Due to the fact that M1 becomes blocking and M3 becomes conducting at the same time, circuit node S1 has a high potential so that M and M4 are blocking. The connection between VS and OUT is thus blocked.

For being able to switch M, a switchable impedance must be present on the high potential side of M5, which is of such magnitude in the blocking state that a sufficiently low potential L is ensured at the gate of M for the conduction of M. This switchable impedance is constituted by M3. For switching M to the blocking state, M3 must be switched to the conducting state. To this end, the switching control branch shown on the right-hand side of FIG. 1 is employed.

Due to the cross-coupling of M3 and M4 by connection of the gate terminals thereof to the circuit node of the respective other switching control branch, a bi-stable behavior of the control circuit is achieved. As long as the potential of VS is sufficiently higher than the potential of OUT, the switching control circuit having the first transistors M1, M2 and the second transistors M3, M4 at all times ensures safe switching of M in accordance with the binary control signal present at C.

The effect achieved due to the switching ON/OFF of M1 and M2 in opposite manner and the cross-coupling of M3 and M4 is that in each of the two switching control branches of the two transistors M1 and M3 as well as M2 and M4, respectively, there is always one switched to the conducting state and the other one switched to the blocking state. In none of the switching conditions of the control circuit controlled via the control signal at C is there a conducting connection between VS and GND, so that this control circuit operates at all times in power-free manner.

Diodes D1, D2 and D3 are provided to prevent the transistor M from reaching an inversely conducting state when the potential at VS drops below the potential at OUT, although transistor M should be blocking by application of a control signal of low potential L to control signal input C. With these potential relationships at VS and OUT, the parasitic drain substrate diodes DSD of M3 and M4 would be conducting. As a consequence, a voltage would occur at the gate of M that is lower than the voltage applied to OUT, which would bring M into an inversely conducting state and would cause a load on, or discharge of, the capacitive load present at OUT. Diodes D1 and D2 prevent this effect by blocking when the potential present at VS becomes too low.

When, with a low potential of the control signal at control signal input C, M1 is blocking and, due to the fact that the potential present at VS is lower than the potential arising at OUT, diode D1 is blocking, the potential at circuit node S1 and thus at the gate of M is floating or undefined. Which potential arises at the gate of M is dependent upon effects that are not predictable, for example capacitive effects, parasitic effects, leakage currents etc. This could lead to the result that M, despite the insertion of diode D1, nevertheless is inversely conducting. This is prevented with the aid of safety transistor M7. Due to the fact that the gate of M7 is connected to VS, inverse conduction of M7 is caused when the potential at VS is lower than the potential at OUT, whereby the potential present at OUT is passed via M7 to circuit node S1 and thus to the gate of M. As a consequence thereof, drain and gate of M have the same potential, namely the potential present at OUT. This prevents inverse conduction of M.

When the substrate of transistor M would be electrically connected to the source thereof, as it is normally for a MOS transistor, a voltage drop at VS below the voltage present at OUT would result in a conducting connection between VS and OUT via the drain source diode DSD of transistor M, which would lead to discharge of the capacitive load from M to VS via DSD. For preventing this, a MOS transistor is used for M whose source and substrate are electrically isolated from each other and are provided with separate electrical terminals, so that the source substrate diode SSD is not electrically bridged as is usual otherwise. Due to the fact that the anode of the parasitic diode SSD of M is directed to VS and this parasitic diode SSD is thus not conducting when the potential at VS drops below the potential of OUT, this parasitic diode constitutes a barrier against discharge of the capacitive load at OUT to VS.

Diode D3 is provided so that, in case of a potential drop of VS to below the potential of OUT, the potential of VS, despite the electrical isolation of source and substrate of transistor M, does not reach the drain terminal of M via the parasitic drain substrate diode DSD. With such potential relationships of VS and OUT, diode D3 is blocking. The discharge path from the capacitive load connected to OUT to the supply voltage input VS is thus safely blocked.

If safety transistor M7 were provided in the form of a MOS transistor having, in the usual manner, substrate and source electrically connected to each other, the result, in case the control signal at control signal input C has a high potential and approx. ground potential is present at circuit node S1 due to the conduction of M1, would be a conducting connection between OUT and GND via a parasitic drain substrate diode DSD of M7, which would lead to discharge of the capacitive load connected to OUT to GND (ground). This is prevented in that a MOS transistor in which source and substrate are electrically isolated from each other and provided with separate electrical terminals is employed also for M7. The thus electrically effective parasitic substrate-source diode SSD of M7 can thus form a barrier against a conducting connection between OUT and GND.

If the substrate or bulk region of M7, which is contacted separately from the source region, were connected directly to OUT, the parasitic source substrate diode SSD of M7 would reach the conducting state when the potential of OUT becomes too negative. This could lead to parasitic effects that could entail disadvantages for the circuits connected to OUT. This is avoided by the provision of diode D4. Diodes D3 and D4 by means of which the separately contacted source and bulk regions of M and M7 are connected to VS and OUT, respectively, are preferably Schottky diodes since these have a lower on-state threshold voltage than PN diodes. For example, if a PN diode were used for D3, the separately contacted source region of M would have a potential that is lower by a PN diode on-state voltage than the potential of VS. The parasitic source substrate diode SSD of M3 could thus be conducting, which is not desired. However, as the Schottky diode on-state voltage of D3 is lower than the PN diode on-state voltage of the parasitic source substrate diode SSD of M, the voltage difference between the source and the substrate or bulk of M is too low for bringing SSD into the conducting state.

A Schottky diode is employed for D4 for the same reasons.

FIGS. 2 and 3 show impedance characteristics of the switching device illustrated in FIG. 1. FIG. 2 shows an impedance characteristic for the case that a high potential H or a binary value "1" is applied to control signal input C and the switching transistor M thus is switched to the conducting state. FIG. 3 shows impedance characteristics for the case that a low potential L or the binary value "0" is present at control signal input C and switching transistor M thus is to be blocking. FIGS. 2 and 3 show currents in accordance with the voltage $V_{OUT}$ present at load output OUT. FIG. 2 shows the current $I_{OUT}$ flowing at load terminal OUT due to conduction of M. FIG. 3 illustrates the current $I_{OUT}$ flowing at load output OUT when switching transistor M is switched to the conducting state as well as the current $I_{VS}$ flowing at supply voltage input S when M is blocking.

It is apparent from FIG. 2 that the switching device according to FIG. 1 behaves in the manner of a linear resistor in the case of voltage values of $V_{OUT}$ that are in the range of the voltage $V_{VS}$ present at supply voltage input VS and, depending on whether $V_{OUT}$ is greater or smaller than $V_{VS}$, conducts current in the one or the other direction. In this middle portion of the impedance characteristics of FIG. 2, the switching device according to FIG. 1 thus behaves like a mechanical electrical switch.

FIG. 3 shows that, when M is blocked, only very low currents flow in the pA range, both as regards the load terminal OUT and as regards the supply voltage input VS, i.e., there flows virtually no current and the switching device according to FIG. 1 is virtually blocking.

The switching device according to the invention can be used in an advantageous manner in all such cases in which, in the conducting state, a low voltage drop, high protection against conduction in the blocking state and as little power consumption as possible are desired. With such properties, the switching device according to the invention is suitable, for example, especially for switched rectifiers, charge pumping circuits and quite generally for switches on the high potential side with low power requirements, as necessary, e.g., in the automotive sector.

FIGS. 4a to 6b schematically illustrate some possible applications for the switching device according to the invention. The figures designated "a" show conventional circuits, whereas the figures designated "b" show circuits with the same basic function, but composed with the switching device according to the invention, with the switching symbol of the switch shown in a rectangular block illustrating a switching device according to the invention.

Figure 4A:
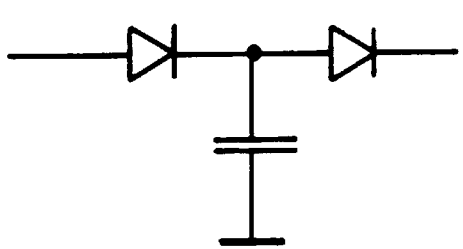
FIG. 4a shows a conventional charge pumping circuit with diodes.
Figure 4B:
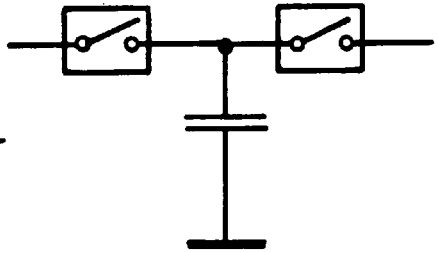
FIG. 4b shows a charge pumping circuit in which diodes are replaced by a switching device according to the invention.
Figure 5A:
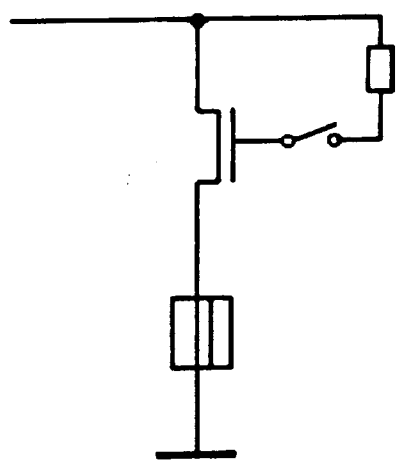
FIG. 5a shows a MOS transistor disposed on a high potential side, having a conventional ON/OFF control system.
Figure 5B:
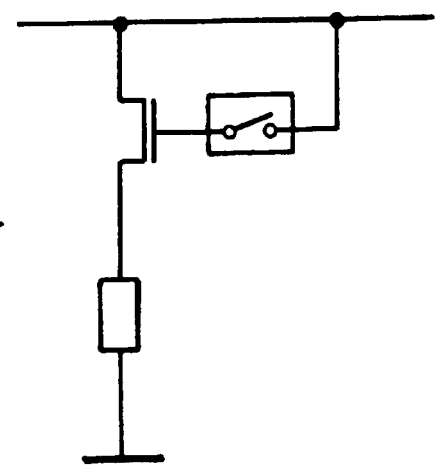
FIG. 5b shows a MOS transistor disposed on a high potential side and having an ON/OFF control system by means of a switching device according to the invention.
Figure 6A:
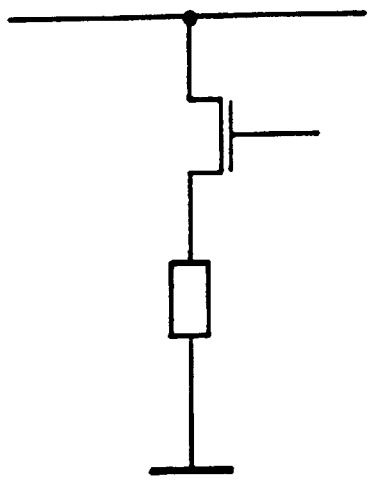
FIG. 6a shows a conventional MOS switch disposed on a high potential side.
Figure 6B:
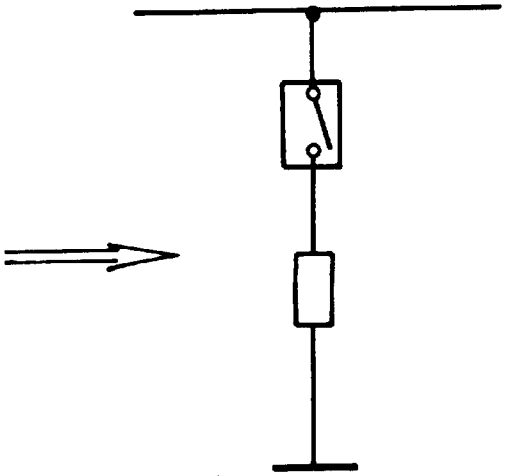
FIG. 6b shows a circuit in which the MOS switch of FIG. 6a is replaced by a switching device according to the invention.

FIGS. 4a and 4b show a charge pumping circuit of conventional construction using diodes and a novel construction using switching devices according to the invention, respectively. FIGS. 5a and 5b show a control means for switching a high potential side MOS transistor by means of a conventional switching device and a switching device according to the invention, respectively. FIGS. 6a and 6b show a high potential side switch of conventional construction using a MOS transistor and of novel construction using a switching device according to the invention, respectively.

I claim:

1. An electrical switching device, comprising:
   a device switch having a control terminal, the device switch including a transistor coupled between a first voltage source and a load terminal;
   a control circuit coupled between the first voltage source and a second voltage source, the control circuit having a control signal input receiving a control signal and a switching signal output connected to the control terminal of the device switch, the control circuit further comprising:
      a first branch having a first switch connected in series with a second switch having a control terminal, the first branch having a first node connected between the first switch and the second switch;
      a second branch having a third switch connected in series with a fourth switch having a control terminal, the second branch having a second node connected between the third switch and the fourth switch, the switching signal output being connected to the first node, the first node being connected to the control terminal of the fourth switch and the second node being connected to the control terminal of the second switch, the control signal input being connected to the first switch and to an input of an inverter, and an output of the inverter being connected to a control terminal of the third switch;
   a first diode connected between the first voltage source and the second switch;
   a second diode connected between the first voltage source and the fourth switch;
   wherein the first and fourth switches are both either in a conducting state or a non-conducting state and the second and third switches are in a state opposite to the state of the first switch, the device switch being controlled between the conducting state and the non-conducting state by the control signal; and
   a safety transistor having a control terminal and being connected between the control terminal of the device switch and the load terminal, the control terminal of the safety transistor being connected to the first voltage source to prevent an inverse flow of current in the device switch.

2. The electrical switching device of claim 1 wherein the device switch comprises:
   a MOS transistor having a drain, a gate, a source, and a substrate, the drain and the substrate being electrically separated from each other by a parasitic diode; and
   a third diode being connected between the first voltage source and the substrate.

3. The electrical switching device of claim 2 wherein the third diode comprises a Schottky diode.

4. The electrical switching device of claim 1 wherein the safety transistor comprises a MOS transistor having a source contact and a substrate contact electrically separated from each other by a parasitic diode, the substrate contact being coupled to the load terminal through a further diode and an anode of the further diode being coupled to the load terminal.

5. The electrical switching device of claim 4 wherein the further diode comprises a Schottky diode.

6. The electrical switching device of claim 1, wherein, in each of the two control circuit branches, between the first node and the first switch and between the second node and the third switch, there is disposed a protective transistor having a control electrode, said control electrodes being commonly connected through a bias voltage source to the first voltage source terminal, a bias voltage value of the bias voltage source being selected such that the two protective transistors are always in the conducting state and, thus, at a terminal of each of the protective transistors coupled to the respective circuit node there is always a voltage value, with respect to the voltage at said first voltage source terminal, which at the most is as large as a difference between the bias voltage value of the bias voltage source and a threshold voltage of the respective protective transistor.

7. A charge pumping circuit for producing a pumping voltage whose voltage is higher than a voltage of a supply voltage source feeding the charge pumping circuit, comprising a T-connected circuit having a series connection of two switching circuits and a pumping capacitor connected at one end to a connecting point between the two switching circuits, wherein each of the two switching circuits comprises:
   a device switch having a control terminal, the device switch including a transistor coupled between a first voltage source and a load terminal;
   a control circuit coupled between the first voltage source and a second voltage source, the control circuit having a control signal input receiving a control signal and a switching signal output connected to the control terminal of the device switch, the control circuit further comprising:
      a first branch having a first switch connected in series with a second switch having a control terminal, the first branch having a first node connected between the first switch and the second switch;
      a second branch having a third switch connected in series with a fourth switch having a control terminal, the second branch having a second node connected between the third switch and the fourth switch, the switching signal output being connected to the first node, the first node being connected to the control terminal of the fourth switch and the second node being connected to the control terminal of the second switch, the control signal input being connected to the first switch and to an input of an inverter, and an output of the inverter being connected to a control terminal of the third switch;

a first diode connected between the first voltage source and the second switch;

a second diode connected between the first voltage source and the fourth switch;

wherein the first and fourth switches are both either in a conducting state or a non-conducting state and the second and third switches are in a state opposite to the state of the first switch, the device switch being controlled between the conducting state and the non-conducting state by the control signal; and a safety transistor having a control terminal and being connected between the control terminal of the device switch and the load terminal, the control terminal of the safety transistor being connected to the first voltage source to prevent an inverse flow of current in the device switch.

8. The charging pump of claim 7, wherein, in each of the two control circuit branches, between the first node and the first switch and between the second node and the third switch, there is disposed a main path of a protective transistor having a control electrode, said control electrodes being commonly connected through a bias voltage source to the first voltage source terminal, a bias voltage value of the bias voltage source being selected such that the two protective transistors are always in the conducting state and, thus, at a terminal of each of the protective transistors coupled to the respective circuit node there is always a voltage value, with respect to the voltage at said first voltage source terminal, which at the most is as large as a difference between the bias voltage value of the bias voltage source and a threshold voltage of the respective protective transistor.

9. A switching control device for switching a MOS switching transistor between a conducting state and a non-conducting state, said MOS switching transistor being disposed on a high potential side of a load and having a main path electrode, which is not connected to the load, connected to a first voltage source terminal and a gate thereof coupled to a gate voltage to switch the MOS switching transistor to the conducting state, the first voltage source terminal comprising a pumping voltage output of a charge pumping circuit, the switching control device comprising:

a device switch having a control terminal, the device switch including a transistor coupled between a first voltage source and a load terminal;

a control circuit coupled between the first voltage source and a second voltage source, the control circuit having a control signal input receiving a control signal and a switching signal output connected to the control terminal of the device switch, the control circuit further comprising:

a first branch having a first switch connected in series with a second switch having a control terminal, the first branch having a first node connected between the first switch and the second switch;

a second branch having a third switch connected in series with a fourth switch having a control terminal, the second branch having a second node connected between the third switch and the fourth switch, the switching signal output being connected to the first node, the first node being connected to the control terminal of the fourth switch and the second node being connected to the control terminal of the second switch, the control signal input being connected to the first switch and to an input of an inverter, and an output of the inverter being connected to a control terminal of the third switch;

a first diode connected between the first voltage source and the second switch;

a second diode connected between the first voltage source and the fourth switch;

wherein the first and fourth switches are both either in a conducting state or a non-conducting state and the second and third switches are in a state opposite to the state of the first switch, the device switch being controlled between the conducting state and the non-conducting state by the control signal; and a safety transistor having a control terminal and being connected between the control terminal of the device switch and the load terminal, the control terminal of the safety transistor being connected to the first voltage source to prevent an inverse flow of current in the device switch.

10. The switching control device of claim 9, wherein, in each of the two control circuit branches, between the first node and the first switch and between the second node and the third switch, there is disposed a protective transistor having a control electrode, said control electrodes being commonly connected through a bias voltage source to the first voltage source terminal, a bias voltage value of the bias voltage source being selected such that the two protective transistors are always in the conducting state and, thus, at a terminal of each of the protective transistors coupled to the respective circuit node there is always a voltage value, with respect to the voltage at said first voltage source terminal, which at the most is as large as a difference between the bias voltage value of the bias voltage source and a threshold voltage of the respective protective transistor.

11. A switching device disposed on a side of a high potential of a load, comprising:

a device switch having a control terminal, the device switch including a transistor coupled between a first voltage source and a load terminal;

a control circuit coupled between the first voltage source and a second voltage source, the control circuit having a control signal input receiving a control signal and a switching signal output connected to the control terminal of the device switch, the control circuit further comprising:

a first branch having a first switch connected in series with a second switch having a control terminal, the first branch having a first node connected between the first switch and the second switch;

a second branch having a third switch connected in series with a fourth switch having a control terminal, the second branch having a second node connected between the third switch and the fourth switch, the switching signal output being connected to the first node, the first node being connected to the control terminal of the fourth switch and the second node being connected to the control terminal of the second switch, the control signal input being connected to the first switch and to an input of an inverter, and an output of the inverter being connected to a control terminal of the third switch;

a first diode connected between the first voltage source and the second switch;

wherein the first and fourth switches are both either in a conducting state or a non-conducting state and the second and third switches are in a state opposite to the state of the first switch, the device switch being controlled between the conducting state and the non-conducting state by the control signal; and a safety transistor having a control terminal and being connected between the control terminal of the device switch and the load terminal, the control terminal of the safety transistor being connected to the first voltage source to prevent an inverse flow of current in the device switch.

12. The switching device of claim 11, wherein, in each of the two control circuit branches, between the first node and the first switch and between the second node and the third switch, there is disposed a main path of a protective transistor having a control electrode, said control electrodes being commonly connected through a bias voltage source to the first voltage source terminal, a bias voltage value of the bias voltage source being selected such that the two protective transistors are always in the conducting state and, thus, at a terminal of each of the protective transistors coupled to the respective circuit node there is always a voltage value, with respect to the voltage at said first voltage source terminal, which at the most is as large as a difference between the bias voltage value of the bias voltage source and a threshold voltage of the respective protective transistor.

13. An electrical switching device, comprising:

a device switch having a control terminal;

a control circuit coupled between a first voltage source and a second voltage source, the control circuit having a control signal input receiving a control signal and a switching signal output connected to the control terminal of the device switch, the control circuit further comprising:

a first branch having a first switch connected in series with a second switch, the second switch having a control terminal, the first branch having a first node connected between the first switch and the second switch;

a second branch having a third switch connected in series with a fourth switch, the fourth switch having a control terminal, the second branch having a second node connected between the third switch and the fourth switch, the switching signal output being connected to the first node, the first node being connected to the control terminal of the fourth switch and the second node being connected to the control terminal of the second switch, the control signal input being connected to the first switch of the first branch and to an input of an inverter, and an output of the inverter being connected to a control terminal of the third switch;

a load connected to the device switch;

a safety transistor having a control terminal, the safety transistor connected between the control terminal of the device switch and the load, the control terminal of the safety transistor being connected to the first voltage source to prevent an inverse flow of current in the device switch; and wherein the first and fourth switches are either in a conducting state or a non-conducting state and the second and third switches are in a state opposite to the state of the first switch of the first branch, the first, second, third, fourth and device switches being controlled between the conducting state and the non-conducting state by the control signal.

14. The electrical switching device of claim 13, wherein, in each of the two branches there is disposed, between the second switch and the first voltage source, a diode having an anode directed towards one of the first and second voltage sources having a higher potential with respect to the other of the first and second voltage sources.

15. An electrical switching device, comprising:

a device MOS transistor having a drain, a gate, a source, and a substrate, the source and the substrate of the device MOS transistor being electrically separated from each other by a parasitic diode;

a control circuit coupled between a first voltage source and a second voltage source, the control circuit having a control signal input receiving a control signal and a switching signal output connected to the gate of the device MOS transistor, the control circuit further comprising:

a first branch having a first switch connected in series with a second switch, the second switch having a control terminal, the first branch having a first node connected between the first switch and the second switch;

a second branch having a third switch connected in series with a fourth switch, the fourth switch having a control terminal, the second branch having a second node connected between the third switch and the fourth switch of the second branch, the switching signal output being connected to the first node, the first node being connected to the control terminal of the fourth switch and the second node being connected to the control terminal of the second switch, the control signal input being connected to the first switch and to an input of an inverter, and an output of the inverter being connected to the third switch;

a diode connected between the first voltage source and the substrate of the device MOS transistor; and wherein the first and fourth switches are both either in a conducting state or a non-conducting state and the second and third switches are both in a state opposite to the state of the first and fourth switches, the first, second, third and fourth switches and the device MOS transistor being controlled between the conducting state and the non-conducting state by the control signal; and wherein a main path of a safety transistor is connected between the gate of the device MOS transistor and a load terminal, said safety transistor having a control electrode connected to the first voltage source and being structured to prevent inverse conduction of the device MOS transistor.

16. The electrical switching device of claim 15 wherein the safety transistor comprises a MOS transistor having a source contact and a substrate contact electrically separated from each other by a parasitic diode, the substrate contact being coupled to the first voltage source through a further diode and an anode of the further diode being coupled to the load terminal.

* * * * *